United States Patent
Fu et al.

(10) Patent No.: US 12,237,282 B2
(45) Date of Patent: Feb. 25, 2025

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Wei-Huan Fu, Tainan (TW); Ying-Tsung Chen, Tainan (TW); Jiun-Jie Huang, Kaohsiung (TW); Wen-Han Hung, Tainan (TW); Jen-Pan Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 181 days.

(21) Appl. No.: 17/738,016

(22) Filed: May 6, 2022

(65) Prior Publication Data
US 2023/0361062 A1 Nov. 9, 2023

(51) Int. Cl.
*H01L 23/00* (2006.01)

(52) U.S. Cl.
CPC .............. *H01L 24/05* (2013.01); *H01L 24/03* (2013.01); *H01L 24/13* (2013.01); *H01L 2224/0345* (2013.01); *H01L 2224/03452* (2013.01); *H01L 2224/0346* (2013.01); *H01L 2224/03466* (2013.01); *H01L 2224/03622* (2013.01); *H01L 2224/0401* (2013.01); *H01L 2224/05017* (2013.01); *H01L 2224/05018* (2013.01); *H01L 2224/05073* (2013.01); *H01L 2224/05082* (2013.01); *H01L 2224/05083* (2013.01); *H01L 2224/05124* (2013.01); *H01L 2224/05147* (2013.01); *H01L 2224/05157* (2013.01); *H01L 2224/05166* (2013.01);
(Continued)

(58) Field of Classification Search
CPC ......... H01L 24/05; H01L 24/03; H01L 24/13; H01L 2224/0346; H01L 2224/03466; H01L 2224/03622; H01L 2224/0401; H01L 2224/05017; H01L 2224/05018; H01L 2224/05559; H01L 2224/05562; H01L 2224/05564; H01L 2224/05573; H01L 2224/13082; H01L 2924/014; H01L 24/11
See application file for complete search history.

(56) References Cited

U.S. PATENT DOCUMENTS

| 11,222,859 | B2 * | 1/2022 | Hsu | ................. H01L 28/60 |
| 2003/0013290 | A1 * | 1/2003 | Greer | ................ H01L 24/05 257/E21.508 |
| 2010/0187687 | A1 * | 7/2010 | Liu | .................. H01L 24/05 257/738 |

* cited by examiner

*Primary Examiner* — Douglas W Owens
(74) *Attorney, Agent, or Firm* — JCIPRNET

(57) ABSTRACT

A semiconductor device includes a device layer, a first passivation layer, an aluminum pad, a second passivation layer, an under-ball metallurgy (UBM) pad and a connector. The device layer is disposed over a substrate, wherein the device layer includes a top metal feature. The first passivation layer is disposed over the device layer. The aluminum pad penetrates through the first passivation layer and is electrically connected to the top metal feature. The second passivation layer is disposed over the aluminum pad. The UBM pad penetrates through the second passivation layer and is electrically connected to the aluminum pad. The connector is disposed over the UBM pad. In some embodiments, a first included angle between a sidewall and a bottom of the aluminum pad is greater than a second included angle between a sidewall and a bottom of the UBM pad.

20 Claims, 13 Drawing Sheets

(52) U.S. Cl.
CPC ............... *H01L 2224/05181* (2013.01); *H01L 2224/05184* (2013.01); *H01L 2224/05186* (2013.01); *H01L 2224/05559* (2013.01); *H01L 2224/05562* (2013.01); *H01L 2224/05564* (2013.01); *H01L 2224/05573* (2013.01); *H01L 2224/05624* (2013.01); *H01L 2224/05644* (2013.01); *H01L 2224/05647* (2013.01); *H01L 2224/05666* (2013.01); *H01L 2224/05681* (2013.01); *H01L 2224/05684* (2013.01); *H01L 2224/05686* (2013.01); *H01L 2224/13082* (2013.01); *H01L 2224/13111* (2013.01); *H01L 2224/13113* (2013.01); *H01L 2224/13139* (2013.01); *H01L 2224/13144* (2013.01); *H01L 2224/13147* (2013.01); *H01L 2224/13155* (2013.01); *H01L 2924/0132* (2013.01); *H01L 2924/014* (2013.01); *H01L 2924/04941* (2013.01); *H01L 2924/04953* (2013.01); *H01L 2924/0496* (2013.01); *H01L 2924/20107* (2013.01); *H01L 2924/20108* (2013.01)

100:101,103,105,107,205,207,400a,400b

100:101,103,105,107,205,207,400a,400b

SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or the critical dimension) has decreased. This scaling down process generally provides benefits by increasing production efficiency and lowering associated costs. Although the existing semiconductor devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
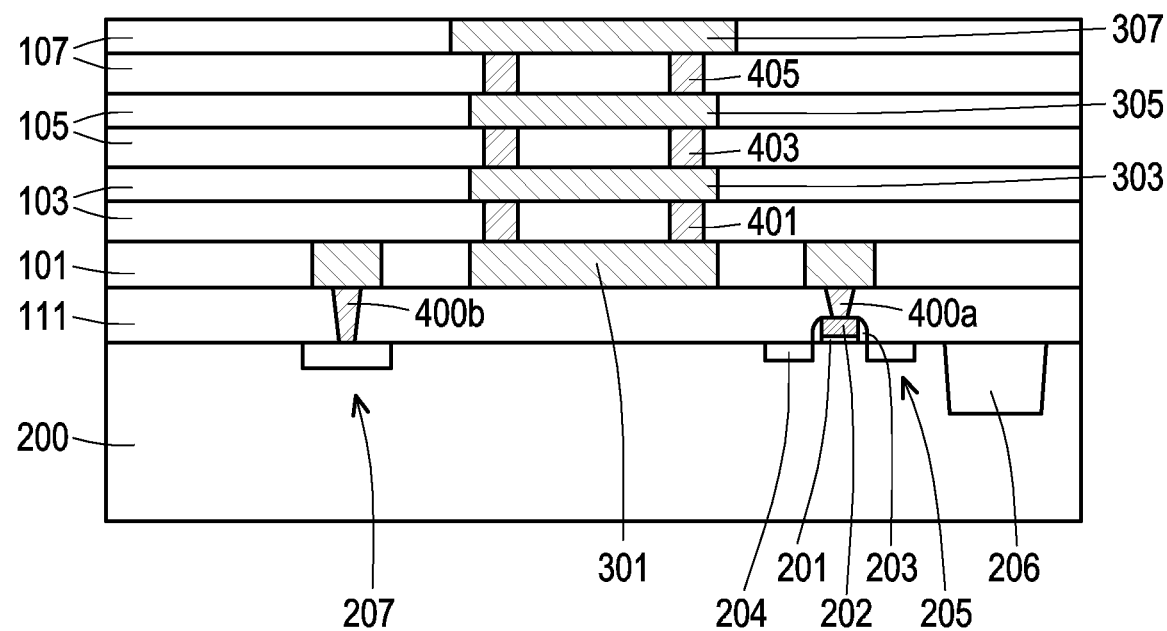
FIG. 1 to FIG. 10 are schematic cross-sectional views of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or act in addition to the orientation depicted in the figures. The apparatus may be otherwise oriented (rotated 90 degrees or at other orientations) and the spatially relative descriptors used herein may likewise be interpreted accordingly.

A conventional high-temperature aluminum pad may damage the performance of the front-end transistor during the high-temperature process. A low-temperature aluminum pad is accordingly developed. However, a conventional low-temperature aluminum pad is formed with poor step coverage and therefore the electrical performance is degraded due to large voids (e.g., having a size of more than about 1 um) formed within the aluminum pad. The above issues are not observed in the disclosure. In some embodiments of the disclosure, the top corner of the opening of the passivation layer in which the low-temperature metal pad is subsequently formed is rounded before the metal pad forming step. Such rounded corner of the opening of the passivation layer promises a better filling and step coverage in the step of forming the metal pad, and thus, a void-free metal pad can be easily obtained.

FIG. 1 to FIG. 10 are schematic cross-sectional views of a method of forming a semiconductor device in accordance with some embodiments.

Referring to FIG. 1, a device layer 100 is formed on a substrate 200. In some embodiments, the device layer 100 includes active and passive devices disposed on or in the substrate 200. The active device includes a logic device, a memory device, the like, or a combination thereof. The passive device includes a capacitor, an inductor, a resistor, the like, or a combination thereof. In some embodiments, the device layer 100 includes a transistor 205 (e.g., an active device) and a passive device 207. An isolation region 206 such as a shallow trench isolation (STI) structure is formed in the substrate 200 to define the active area of the chip.

In some embodiments, the substrate 200 includes silicon and/or elementary semiconductor such as germanium. Alternatively or additionally, the substrate may include a compound semiconductor such as silicon carbide, gallium arsenide, indium arsenide, and/or indium phosphide. In some embodiments, the substrate 200 may include a silicon-on-insulator (SOI) structure. The substrate 200 may also include various doping configurations depending on design requirements as is known in the art such as P-type substrate and/or N-type substrate and various doped regions such as P-wells and/or N-wells.

In some embodiments, the transistor 205 may be an active device, including a lateral transistor, a vertical transistor, a bipolar device or the like. For example, the transistor 205 is a FinFET device, a tunnel FET ("TFET") device, a gate-all-around ("GAA") device or a suitable device depending on the circuitry design. In some embodiments, the transistor 205 includes a gate dielectric layer 201, a gate electrode 202 over the gate dielectric layer 201, and a spacer 203 aside the gate electrode 202.

The gate dielectric layer 201 may include a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In other embodiments, the gate dielectric layer 201 can optionally include a silicate such as HfSiO, LaSiO, AlSiO, the like, or a combination thereof.

The gate electrode 202 may include a metal material suitable for forming a metal gate or portion thereof. In some embodiments, the gate electrode 202 includes a work function metal layer and a fill metal layer on the work function metal layer. The work function metal layer is an N-type work function metal layer and/or a P-type work function metal layer. In some embodiments, the N-type work function metal layer includes TiAl, TiAlN, or TaCN, conductive metal oxide, and/or a suitable material. In other embodiments, the P-type work function metal layer includes TiN, WN, TaN, conductive metal oxide, and/or a suitable material. The fill metal layer includes copper, aluminum, tungsten, or a suitable material.

The spacer 203 may include a nitrogen-containing dielectric material, a carbon-containing dielectric material or both, and the spacer 203 has a dielectric constant less than about 10, or even less than about 5. In some embodiments, the spacer 203 include SiN, SiCN, SiOCN, SiOR (wherein R is an alkyl group such as $CH_3$, $C_2H_5$ or $C_3H_7$), SiC, SiOC, SiON, the like, or a combination thereof.

In some embodiments, the transistor 205 further includes two source/drain regions 204 in the substrate 200 beside the gate electrode 202. In some embodiments, each of the source/drain regions 204 includes silicon germanium (SiGe) for a P-type device. In other embodiments, each of the source/drain regions 204 includes silicon carbon (SiC), silicon phosphate (SiP), SiCP or a SiC/SiP multi-layer structure for an N-type device. In some embodiments, the source/drain regions 204 may be optionally implanted with a P-type dopant or an N-type dopant as needed.

In some embodiments, the passive device 207 includes a capacitor, an inductor, a resistor, the like, or a combination thereof.

In some embodiments, the device layer 100 further includes an interconnect structure electrically connected to the transistor 205 and the passive device 207.

A bottom metal layer 101 of the interconnect structure is separated from the substrate 200 by an inter-layer dielectric (ILD) layer 111. The bottom metal layer 101 includes multiple bottom metal lines 301. The bottom metal lines 301 are electrically connected to the transistor 205 and the passive device 207 through contacts 400a and 400b, respectively.

In some embodiments, the ILD layer 111 may be made of one or more suitable dielectric materials such as silicon oxide, silicon nitride, silicon oxynitride, phosphosilicate glass (PSG), borosilicate glass (BSG), boron-doped phosphosilicate glass (BPSG), a low-k dielectric material (e.g., having a dielectric constant less than 4) such as carbon doped oxide, an extremely low-k dielectric material (e.g., having a dielectric constant less than 3 or 2.5) such as porous carbon doped silicon dioxide, the like, or a combination thereof. In some embodiments, the ILD layer 111 is formed by a suitable deposition technique such as spin-coating, chemical vapor deposition (CVD), flowable CVD, plasma-enhanced CVD (PECVD), atomic layer deposition (ALD), the like, or a combination thereof. In some embodiments, the bottom metal lines 301 and the contacts 400a and 400b include Al, Cu, AlCu, Au, Ti, TiN, Ta, TaN, W, WN or a combination thereof, and are formed by a suitable patterning technique such as multiple damascene processes or a dual damascene process, each of which includes sputtering, plating, PVD, CVD, ALD, the like, or a combination thereof.

The top metal feature is a term known to those with ordinary skill in the art. The top metal layer 107 of the interconnect structure is the top metal feature of a chip so that there is no other metal layer above the metal layer 107 within the chip. The top metal layer 107 includes a top metal line 307 and underlying top metal vias 405. The materials and forming methods of the top metal line 307 and the top metal vias 405 are similar to those of the bottom metal lines 301 and the contacts 400a and 400b described above, so the details are not iterated herein.

The metal layers 103 and 105 of the interconnect structure are the middle metal layers between the bottom metal layer 101 and the top metal layer 107. The metal layer 103 includes a middle metal line 303 and underlying middle metal vias 401. The middle metal line 303 is electrically connected to the bottom metal line 301 through the middle metal vias 401. The metal layer 105 includes a middle metal line 305 and underlying middle metal vias 403. The middle metal line 305 is electrically connected to the middle metal line 303 through the middle metal vias 403. The materials and forming methods of the middle metal lines 303, 305 and the middle metal vias 101, 403 are similar to those of the bottom metal lines 301 and the contacts 400a and 400b described above, so the details are not iterated herein.

The bottom metal layer 101, the top metal layer 107, and the middle metal layers 103 and 105 are embedded by inter-metal dielectric (IMD) layers. The materials and forming methods of the IMD layers are similar to those of the ILD layer 111 described above, so the details are not iterated herein.

The above embodiments in which the interconnect structure includes four metal layers are provided for illustration purposes, and are not construed as limiting the present disclosure. In other embodiments, the interconnect structure may include five or more metal layers upon the design of the device layer 100.

Figure 2:
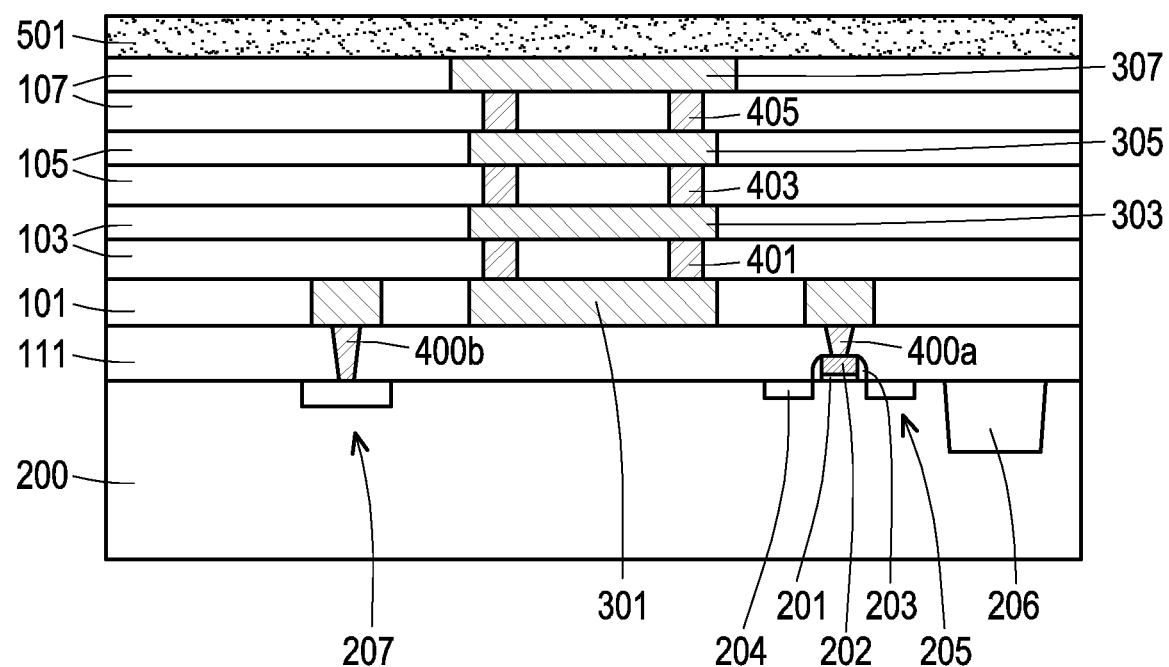

Referring to FIG. 2, a first passivation layer 501 is formed over the device layer 100. In some embodiments, the first passivation layer 501 includes a dielectric material such as silicon oxide, silicon nitride, silicon oxynitride, phosphosilicate glass (PSG), borosilicate glass (BSG), boron-doped phosphosilicate glass (BPSG), or the like. Other materials may be applicable. For example, the first passivation layer 501 includes a polymer material, such as polybenzoxazole (PBO), polyimide, benzocyclobutene (BCB), or the like. The first passivation layer 501 is formed by a suitable deposition technique spin-coating, chemical vapor deposition (CVD), flowable CVD, plasma-enhanced CVD (PECVD), or the like.

Figure 3:
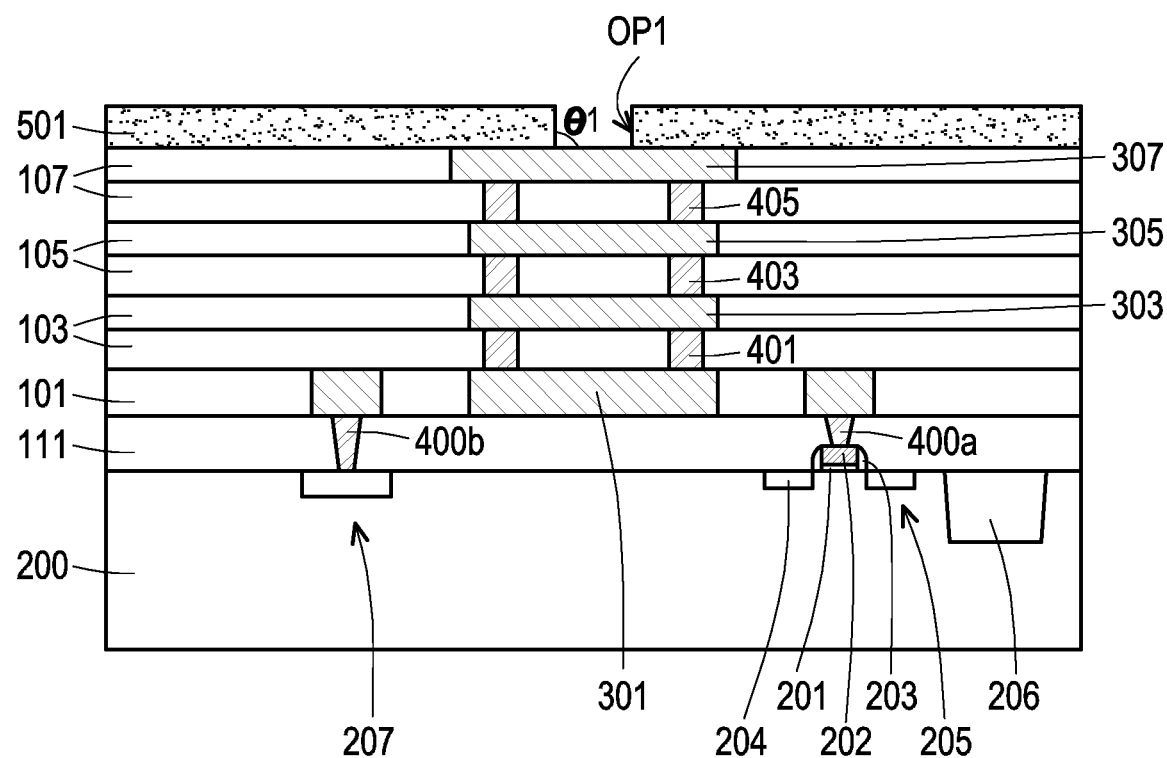

Referring to FIG. 3, the first passivation layer 501 is patterned to form a first opening OP1 that exposes the top metal line 307. In some embodiments, a mask layer (e.g., photoresist layer) is formed on the first passivation layer 501, and the opening of the mask layer corresponds to the intended location of the subsequently formed pad opening. The first passivation layer 501 is then partially removed by using the mask layer as a mask, so as to form the first opening OP1 with sharp top corners. In some embodiments, the patterning step includes performing an etching process. In some embodiments, the first included angle θ1 between the sidewall and the bottom of the first opening OP1 of the first passivation layer 501 ranges from about 85 to 95 degrees, such as 90 degrees, although other values within the range may be possible.

Figure 4:
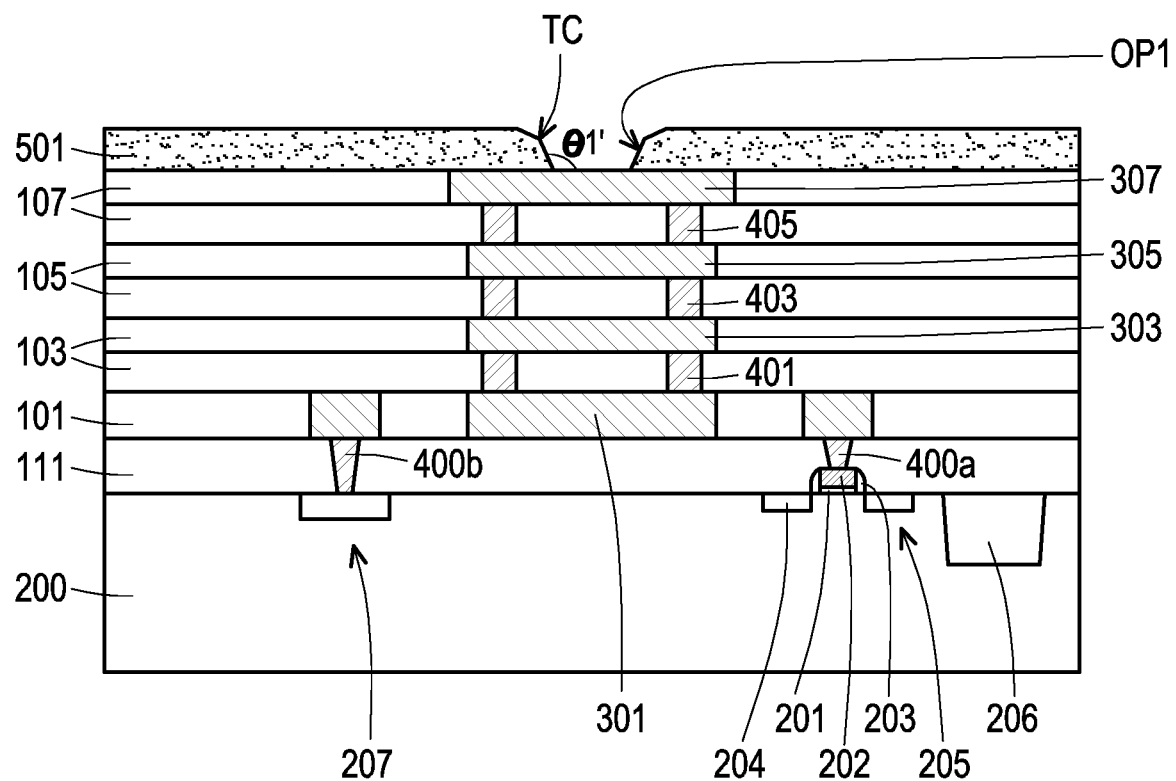

Referring to FIG. 4, a trimming process is performed to the first passivation layer 501 to round a top corner TC of the first opening OP1. In some embodiments, the trimming process includes performing a plasma process or an etching process such as a dry etching. Upon the trimming process, the top corner TC of the first opening OP1 is rounded and the sidewall of the first opening OP1 is inclined, so as to provide a wide-top and narrow-bottom opening. In some embodiments, the first included angle θ1' between the sidewall and the bottom of the first opening OP1 of the first passivation layer 501 ranges from about 100 to 120 degrees, such as 105, 110 or 115 degrees, although other values within the range may be possible.

Figure 5:
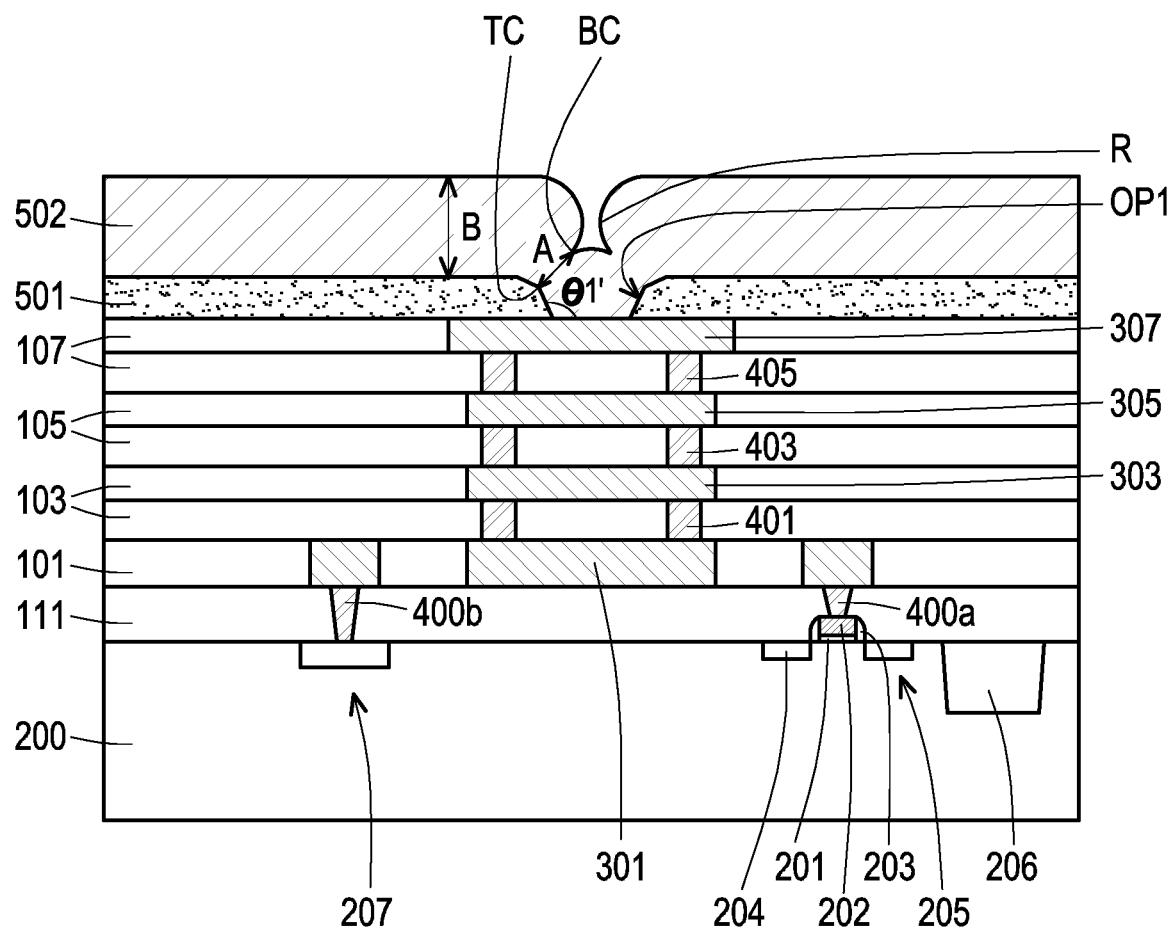

Referring to FIG. 5, an aluminum layer 502 is formed over the first passivation layer 501, and the aluminum layer 502 fills in the first opening OP1 and in contact with the top metal line 307. In some embodiments, the aluminum layer 502 is formed by a low-temperature PVD process, in which the process temperature ranges from about 250° C. to 300° C., such as 260° C., 270° C., 280° C. or 290° C., although other values within the range may be possible. Due to a low-temperature process, the aluminum layer 502 is referred to as a "cold aluminum layer" in some examples. Such low-temperature process would not damage the performance of the device layer 100. The rounded top corners TC and included sidewall of the first opening OP1 of the first passivation layer 501 promise a better filling and step coverage in the step of forming the low-temperature aluminum layer 502. In some embodiments, the thickness of the aluminum layer 502 ranges from about 1 to 3 um, such as 1.2 to 1.5 um, although other values within the range may be possible.

In some embodiments, the aluminum layer 502 is formed with a recess R on a surface thereof, and the recess R corresponds to the first opening OP1. In some embodiments, the recess R is formed having a wide upper portion, a narrow middle portion and a wide lower portion. In some embodiments, the recess R is described as having a narrow-middle profile, such as a vase-shaped profile, an hourglass-shaped profile, a Coca-Cola glass shaped profile, or the like. The narrow-middle profile indicates a profile that is narrow in a middle portion thereof, and the middle portion is less than each of the top portion and bottom portion thereof.

In some embodiments, the corner rounding step of the disclosure provides a better filling and step coverage for the subsequently formed low-temperature aluminum layer 502. Accordingly, the distance "A" from the rounded top corner TC of the first passivation layer 501 to the bottom corner BC of the recess R is significantly increased as compared to the distance formed by the conventional method without a corner rounding step. Besides, the thickness of the aluminum layer 502 is defined as "B". In some embodiments, the ratio of "A" to "B" is about 25% to 60%, such as 30%, 40%, 45%, 50% or 55%, although other values within the range may be possible. Similarly, the ratio of "A" to "B" is significantly increased as compared to the ratio of the conventional method without a corner rounding step. The higher ratio of "A" to "B" indicates a better step coverage. The ratio of "A" to "B" is referred to as a "step coverage rate" in some examples.

Figure 6:
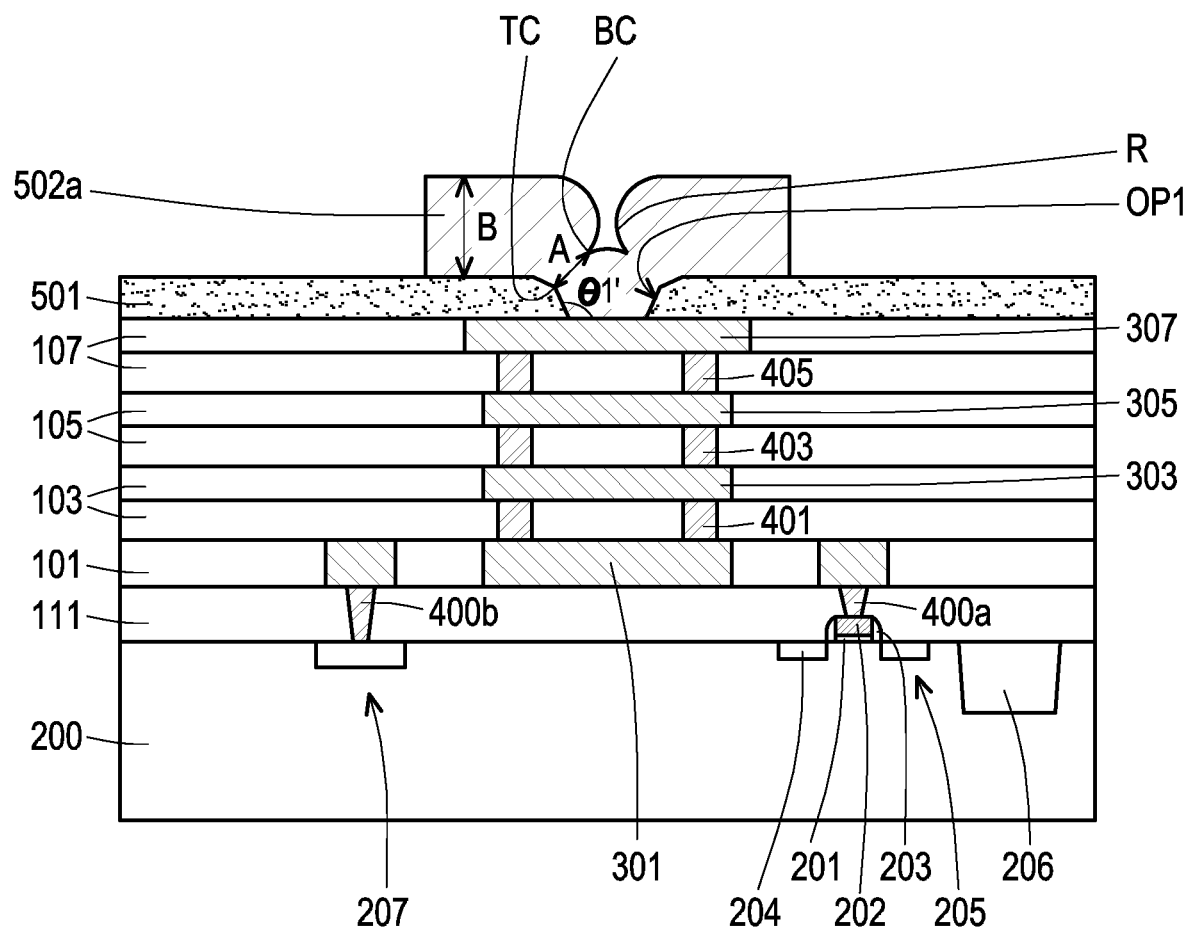

Referring to FIG. 6, the aluminum layer 502 is patterned to form an aluminum pad 502a. In some embodiments, a mask layer (e.g., photoresist layer) is formed on the aluminum layer 502. The aluminum layer 502 is then partially removed by using the mask layer as a mask, so as to form the aluminum pad 502a with the recess R on a surface thereof. In some embodiments, the patterning step includes performing an etching process.

In some embodiments, some of the aluminum pads 502a across the chip have probe marks on the top surfaces thereof, and the semiconductor chip is referred to as a "known good die". In other embodiments, the aluminum pads 502a across the chip are free of probe marks.

Figure 7:
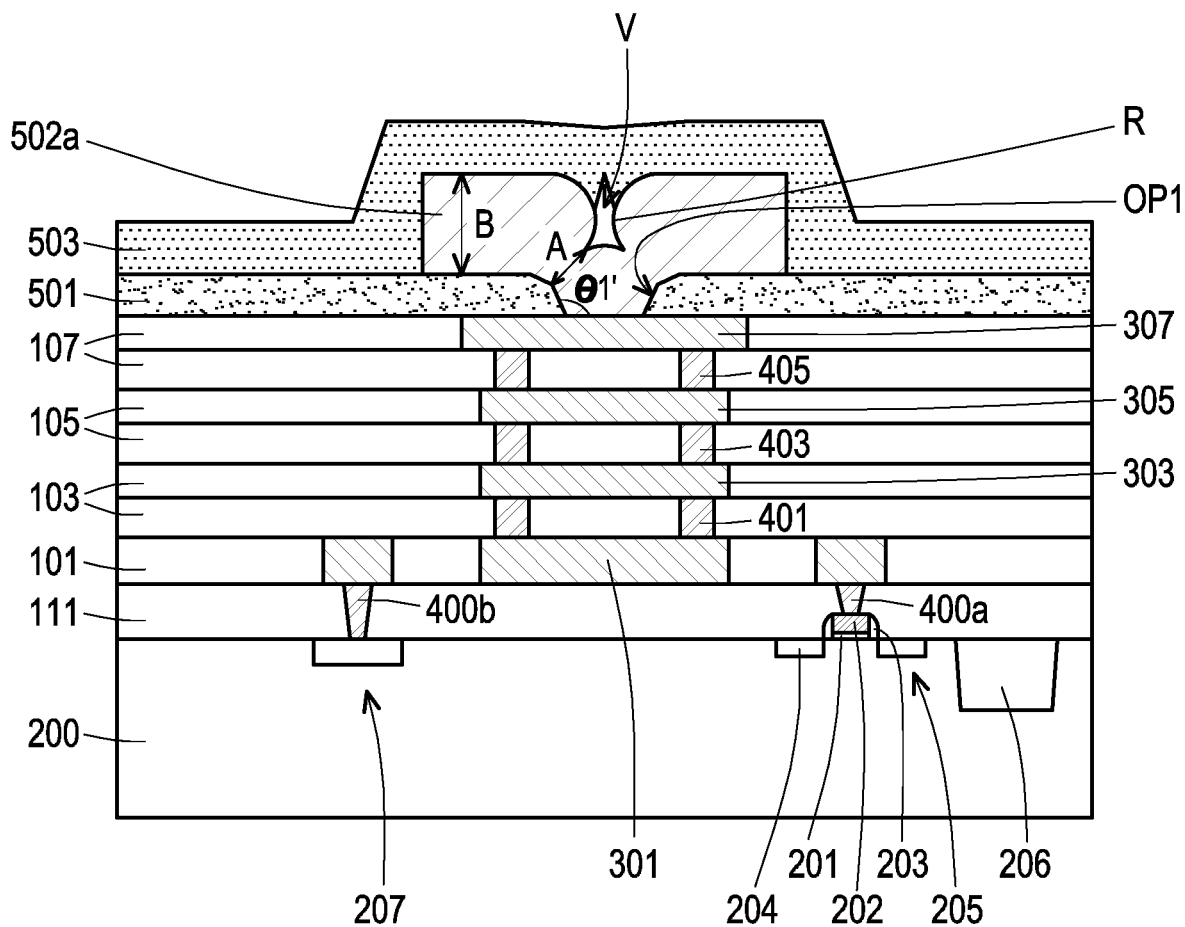

Referring to FIG. 7, a second passivation layer 503 is formed over the aluminum pads 502a. In some embodiments, the second passivation layer 503 includes a dielectric material such as silicon oxide, silicon nitride, silicon oxynitride, phosphosilicate glass (PSG), borosilicate glass (BSG), boron-doped phosphosilicate glass (BPSG), or the like. Other materials may be applicable. For example, the second passivation layer 503 includes a polymer material, such as polybenzoxazole (PBO), polyimide, benzocyclobutene (BCB), or the like. The second passivation layer 503 is formed by a suitable deposition technique such a spin-coating, chemical vapor deposition (CVD), flowable CVD, plasma-enhanced CVD (PECVD), or the like.

In some embodiments, the second passivation layer 503 caps the recess R of the aluminum pad 502a, so as to form a void V enclosed by part of the aluminum pad 502a and part of the second passivation layer 503. In some embodiments, the void V is described as having a triangle-like shape. Other irregular shapes may be possible. However, the disclosure is not limited thereto. In other embodiments, the second passivation layer 503 completely fills the recess R of the aluminum pad 502a.

In some embodiments, the second passivation layer 503 and the first passivation layer 501 include the same material (e.g., silicon oxide). In other embodiments, the second passivation layer 503 and the first passivation layer 501 include different materials (e.g., polymer material and dielectric material). For examples, the second passivation layer 503 includes a material that is more hydrophobic than the material included in the first passivation layer 501, so as to effectively block water or moisture from penetrating into the device layer 100.

In some embodiments, the thickness of the second passivation layer 503 is different from (e.g., greater than) the thickness of the first passivation layer 501. In some embodiments, the thickness of the second passivation layer 503 ranges from about 1 to 1.5 um, and the thickness of the first passivation layer 501 ranges from about 0.5 to 0.8 um. However, the disclosure is not limited thereto. In other embodiments, the second passivation layer 503 and the first passivation layer 501 may have the same thickness.

Figure 8:
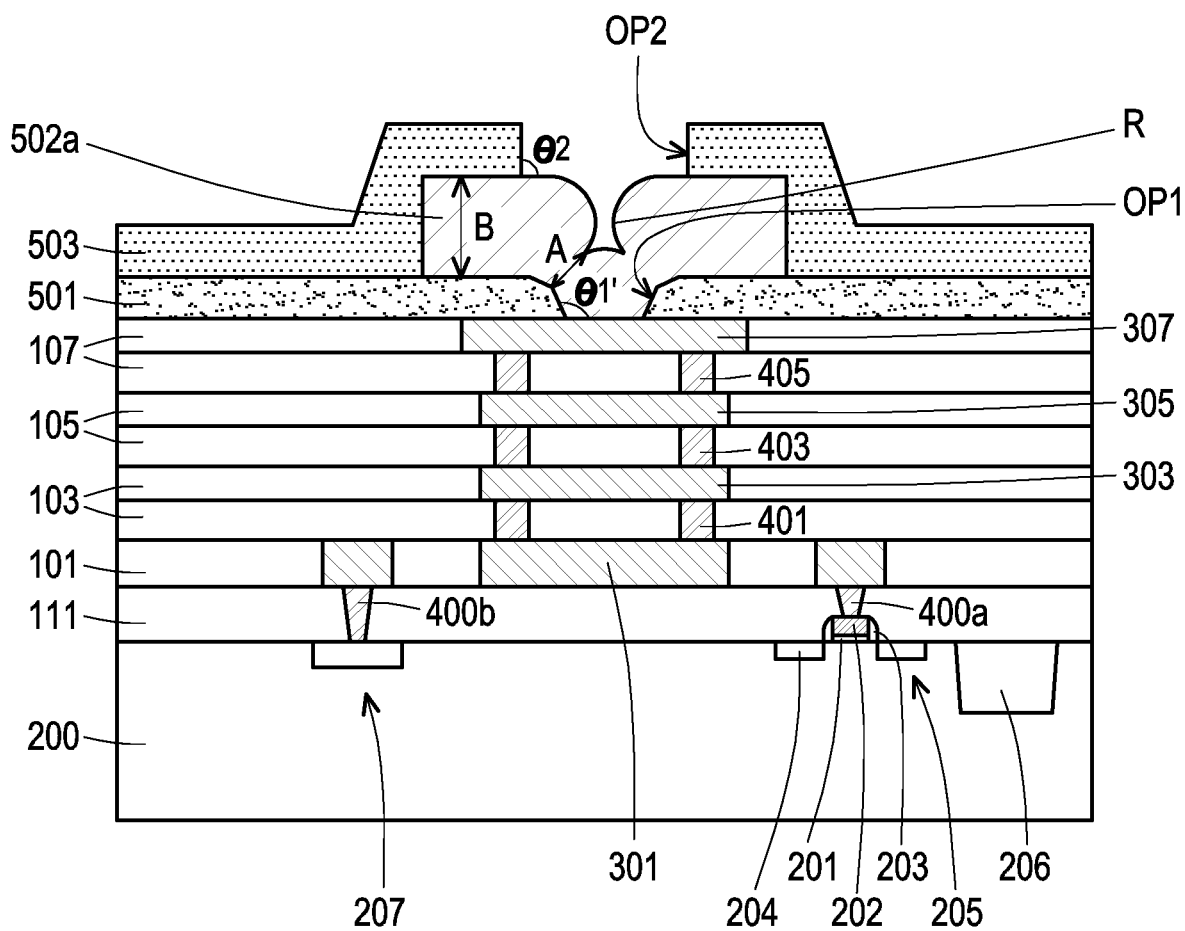

Referring to FIG. 8, the second passivation layer 503 is patterned to form a second opening OP2 that exposes the aluminum pad 502a. Specifically, the second opening OP2 corresponds to and exposes the recess R of the aluminum pad 502a. In some embodiments, a mask layer (e.g., photoresist layer) is formed on the second passivation layer 503, and the opening of the mask layer corresponds to the intended location of the subsequently formed pad opening. The second passivation layer 503 is then partially removed by using the mask layer as a mask, so as to form the second opening OP2 with sharp top corners. In some embodiments, the patterning step includes performing an etching process. In some embodiments, the first included angle 82 between the sidewall and the bottom of the second opening OP2 of the second passivation layer 503 ranges from about 85 to 95 degrees, such as 90 degrees, although other values within the range may be possible.

Figure 9:
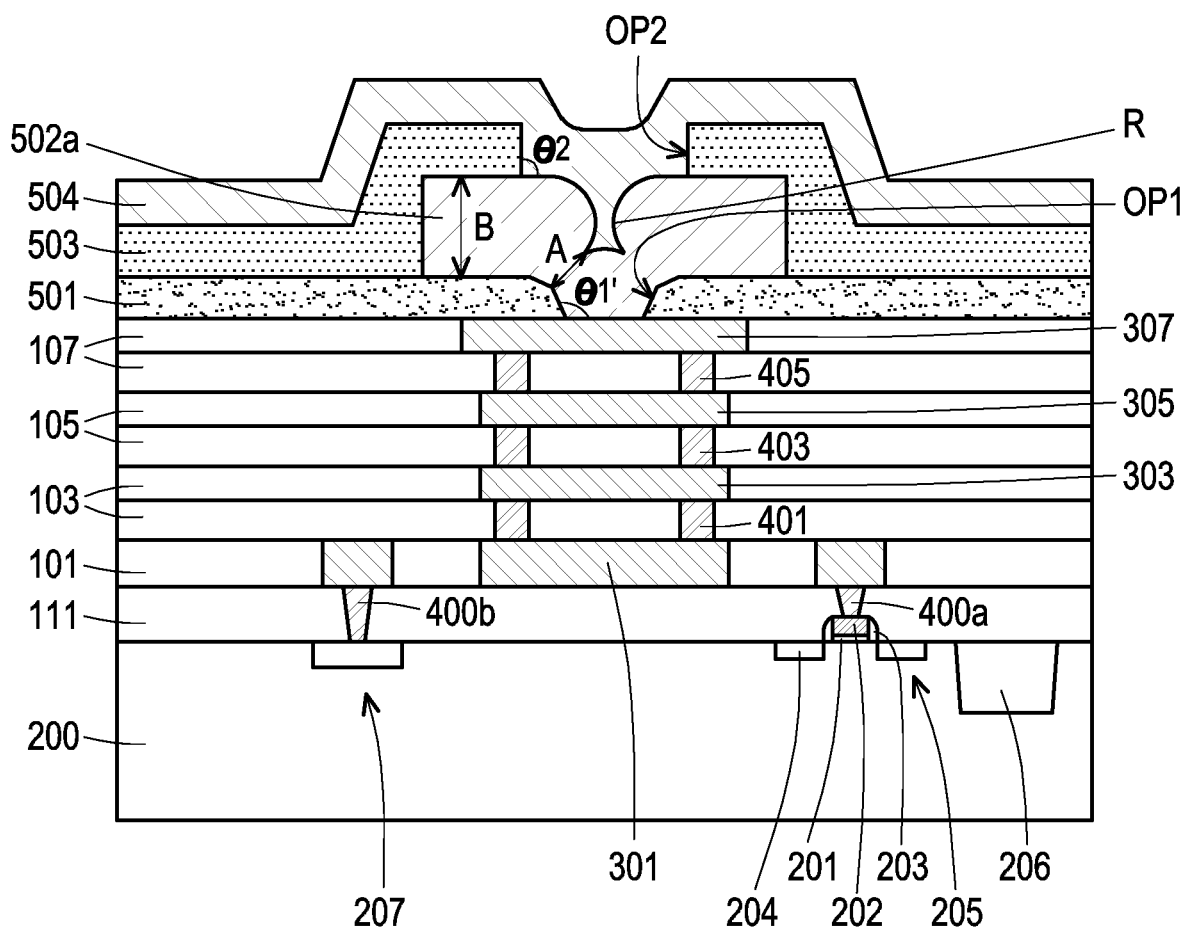

Referring to FIG. 9, an under bump metallization (UBM) layer 504 is formed over the second passivation layer 503, and the UBM layer 504 fills in the second opening OP2 and in contact with the aluminum pad 502a. In some embodiments, the UBM layer 504 includes Al, Cu, AlCu, Au, Ti, TiN, Ta, TaN, W, WN or a combination thereof. In some embodiments, the UBM layer 504 includes a layer of conductive material, such as a layer of titanium, or a layer of nickel. In some embodiments, the UBM layer 504 includes multiple sub-layers, such as Ti/Cu. In some embodiments, the UBM layer 504 is formed by a suitable patterning technique such as sputtering, plating, PVD, CVD, ALD, the like, or a combination thereof.

Figure 10:
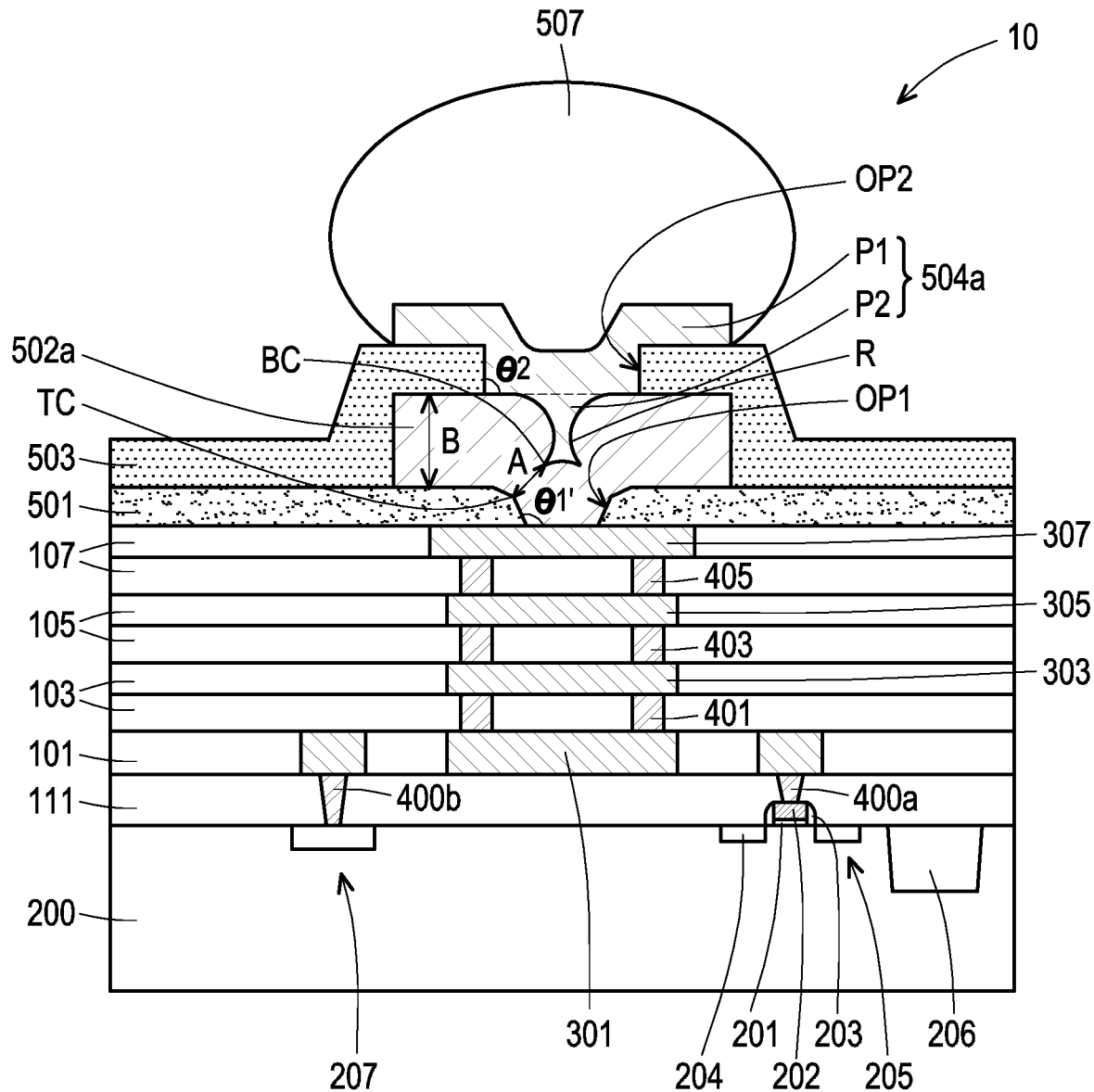

Referring to FIG. 10, the UBM layer 504 is patterned to form a UBM pad 504a. In some embodiments, a mask layer (e.g., photoresist layer) is formed on the UBM layer 504. The UBM layer 504 is then partially removed by using the mask layer as a mask, so as to form the UBM pad 504a. In some embodiments, the patterning step includes performing an etching process.

In some embodiments, the UBM pad 504a is formed having a main portion P1 and a protruding portion P2 extending from the main portion P1, and the protruding portion P2 is embedded in the recess R of the aluminum pad 502a. In some embodiments, the UBM pad 504a has a recess on a top surface thereof, and the recess corresponds to the recess R of the aluminum pad 502a.

Thereafter, a connector 507 is formed on the UBM pad 504a. In some embodiments, the connector 507 includes an electrically conductive material, such as Sn, Ni, Au, Ag, Cu, bismuthinite (Bi), the like, an alloy thereof, or a combination thereof. In some embodiments, the connector 507 may be a solder ball. In some embodiments, the connector 507 may be a Cu/SnAg solder ball. In some embodiments, a copper bump instead of a solder ball may be used as the connector 507. In some embodiments, the connector 507 may be placed on the UBM pad 504a to connect the aluminum pad 502a to another semiconductor device, another chip, a package, a board, an interposer, or the like. A semiconductor device 10 of the disclosure is thus completed.

Solder bumps are widely used to form electrical interconnect in flip chip technology or other types of technologies for IC packaging. Various sizes of solder balls or bumps are in use. A solder ball of a diameter size around 350 um to 500 um may be called a package bump and used to connect a device to a printed circuit board (PCB). A solder bump of a diameter size around 50 um to 150 um may be called a flip-chip bump and used to connect a device to a package substrate. The sizes of different solder balls or bumps are described for illustration purpose only and are not limiting. With the continuous reduction of feature sizes and package sizes, the sizes in embodiments may become smaller than the ones described above. On the other hand, the connector 507 may be of a bigger size such as a size of a flip-chip bump or a package bump as well, depending on the particular applications of interest. Alternatively, connectors other than a solder ball may be placed above the UBM pad 504a to make electrical connections.

Possible modifications and alterations can be made to the described semiconductor device. These modifications and alterations are provided for illustration purposes, and are not construed as limiting the present disclosure.

Figure 11:
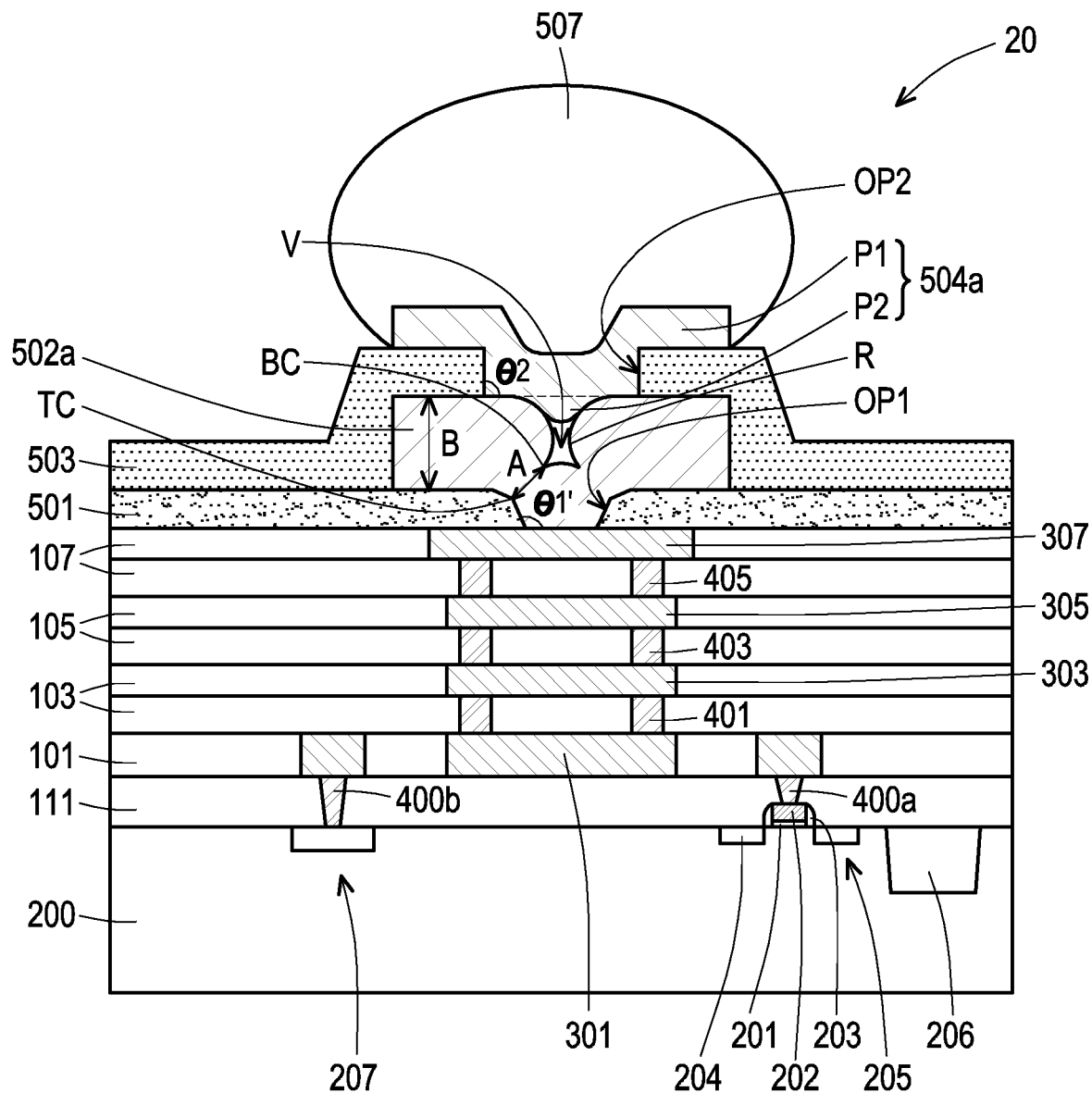
FIG. 11 is a schematic cross-sectional view of a semiconductor device in accordance with some embodiments.
Figure 12:
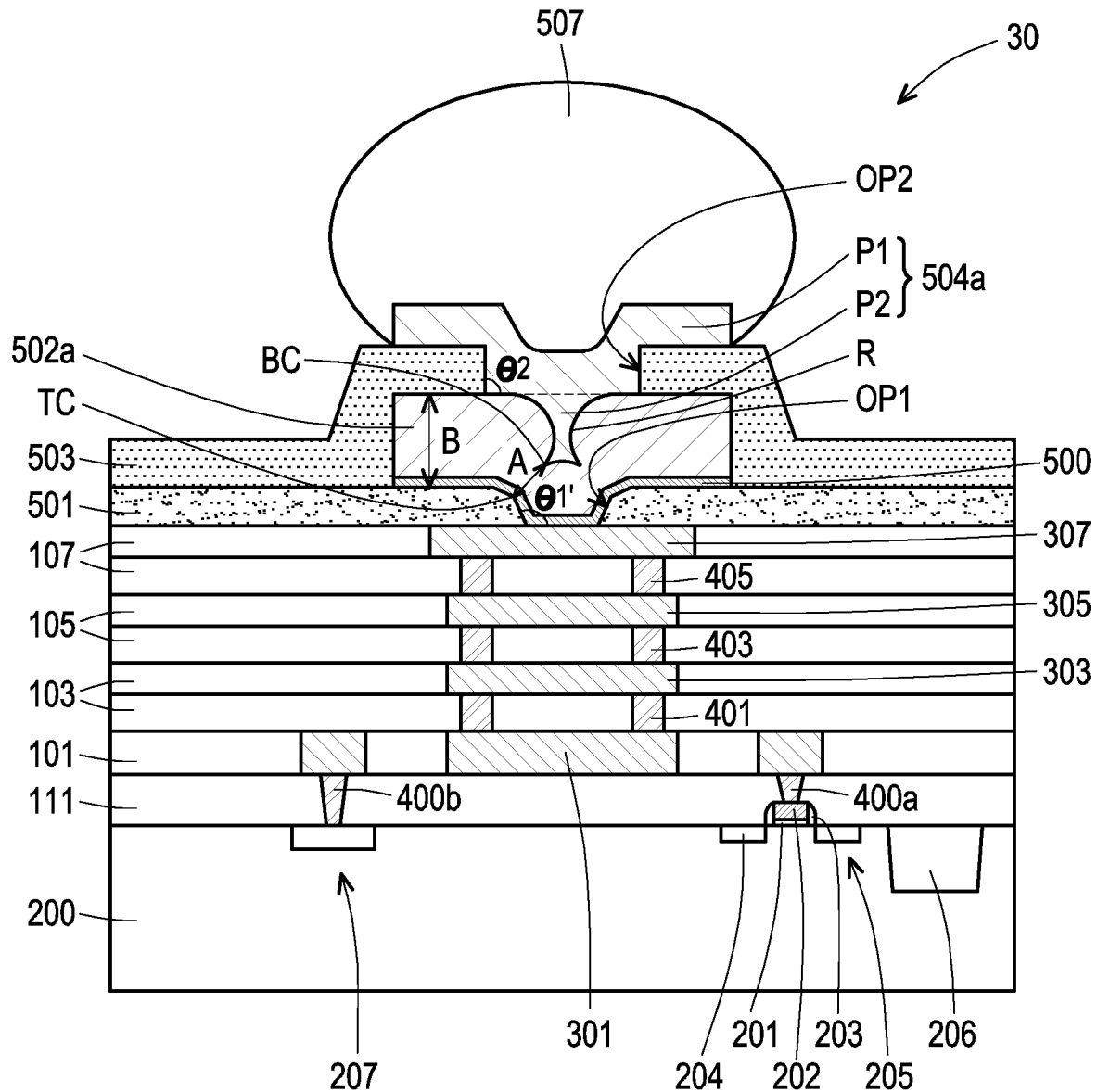
FIG. 12 is a schematic cross-sectional view of a semiconductor device in accordance with some embodiments.

FIG. 11 to FIG. 12 are schematic cross-sectional views of semiconductor devices in accordance with some embodiments. Similar features of the semiconductor devices are labeled with similar numerical references and descriptions of the similar features are not repeated herein.

The semiconductor device 20 of FIG. 11 is similar to the semiconductor device 10 of FIG. 10, and the difference between them lies in the configuration of the UBM pad. In the semiconductor device 10 of FIG. 10, the UBM pad 504a completely fills the recess R of the aluminum pad 502a. However, in the semiconductor device 20 of FIG. 11, the UBM pad 504a partially fills the recess R of the aluminum pad 502a, and thus, a void V is present between the UBM pad 504a and the aluminum pad 502a. In some embodiments, the size of the void V is relatively small (e.g., less than about 0.5 um or 0.1 um), and such small-size void would not affect the electrical performance of the semiconductor device.

The semiconductor device 30 of FIG. 12 is similar to the semiconductor device 10 of FIG. 10, and the difference between them lies in that the semiconductor device 30 further includes a glue layer 500 between the aluminum pad 504a and the first passivation layer 501. In some embodiments, the glue layer 500 includes AlCu. In some embodiments, a barrier layer may be provided instead of the glue layer. In some embodiments, the barrier layer may include Ta, TaN, Ti, TiN, CoW or a combination thereof. In some embodiments, a small void V may be present between the UBM pad 504a and the aluminum pad 502a in the semiconductor device 30 of FIG. 12.

The above embodiments in which a low-temperature aluminum pad is provided for illustration purposes, and are not construed as limiting the present disclosure. In other embodiments, the corner rounding step of the disclosure may be applied to another low-temperature metal forming step, so as to provides a better filling and step coverage for the subsequently formed low-temperature metal layer. For examples, the low-temperature metal layer includes Cu, and the glue layer may be Ti/Cu. Other metals may be applicable.

The semiconductor devices of the disclosure are illustrated below with reference to FIG. 10 to FIG. 12.

In accordance with some embodiments of the present disclosure, a semiconductor device 10/20/30 includes a device layer 100, a first passivation layer 501, an aluminum pad 502a, a second passivation layer 503, an UBM pad 504a and a connector 507. The device layer 100 is disposed over a substrate 200, wherein the device layer 100 includes a top metal feature (e.g., top metal line 307). The first passivation layer 501 is disposed over the device layer 100. The aluminum pad 502a penetrates through the first passivation layer 501 and is electrically connected to the top metal feature (e.g., top metal line 307). The second passivation layer 503 is disposed over the aluminum pad 502a. The UBM pad 504a penetrates through the second passivation layer 503 and is electrically connected to the aluminum pad 502a. The connector 507 is disposed over the UBM pad 504a. In some embodiments, a first included angle θ1' between a sidewall and a bottom of the aluminum pad 502a is greater than a second included angle θ2 between a sidewall and a bottom of the UBM pad 504a. In some embodiments, the first included angle θ1' ranges from about 100 to 120 degrees. In some embodiments, the second included angle θ2 ranges from about 85 to 95 degrees.

In some embodiments, the aluminum pad 502a has a recess R on a surface thereof, and the UBM pad 504a fills into the recess R. In some embodiments, the recess R of the aluminum pad 502a has a wide-top and narrow-middle profile. In some embodiments, a void V is further present between the aluminum pad 502a and the UBM pad 504a. In some embodiments, the first passivation layer 501 has a rounded top corner TC in contact with the aluminum pad 502a. In some embodiments, the semiconductor device 30 further includes a glue layer 500 between the aluminum pad 502a and the first passivation layer 501.

In accordance with some embodiments of the present disclosure, a semiconductor device 10/20/30 includes a device layer 100, a first passivation layer 501, a first metal pad (e.g., aluminum pad 502a), a second passivation layer 503, a second metal pad (e.g., UBM pad 504a) and a connector 507. The device layer 100 is disposed over a substrate 200, wherein the device layer 100 includes a top metal feature (e.g., top metal line 307). The first passivation layer 501 is disposed over the device layer 100. The first metal pad (e.g., aluminum pad 502a) penetrates through the first passivation layer 501 and is electrically connected to the top metal feature. The second passivation layer 503 is disposed over the first metal pad. The second metal pad (e.g., UBM pad 504a) penetrates through the second passivation layer 503 and is electrically connected to the first metal pad. The connector 507 is disposed over the second metal pad. In some embodiments, the second metal pad (e.g., UBM pad 504a) has a main portion P1 and a protruding portion P2 extending from the main portion P1, and the protruding portion P2 is embedded in the first metal pad (e.g., aluminum pad 502a).

From another point of view, the first metal pad is formed with a concave portion (e.g., recess R) on a top surface thereof, and the second metal pad is formed with a convex portion (e.g., protruding portion P2) on a bottom surface thereof, and the convex portion of the second metal pad is engaged in the concave portion of the first metal pad.

In some embodiments, the connector 507 covers a sidewall of the second metal pad. In some embodiments, the connector 507 is in contact with the second passivation layer 503. However, the disclosure is not limited thereto. In some embodiments, the connector 507 is separated from the second passivation layer 503.

In some embodiments, a distance from a top corner TC of the first passivation layer 501 to a corner BC of the protruding portion P2 of the second metal pad (e.g., UBM pad 504a) is defined as "A", a thickness of the first metal pad (e.g., aluminum pad 502a) is defined as "B", and a ratio of "A" to "B" is about 25% to 60%.

In some embodiments, the first metal pad and the second metal pad include different materials. In some embodiments, the first metal pad includes aluminum, and the second metal pad includes copper. However, the disclosure is not limited thereto. In other embodiments, the first metal pad and the second metal pad include the same material, such as copper.

Figure 13:
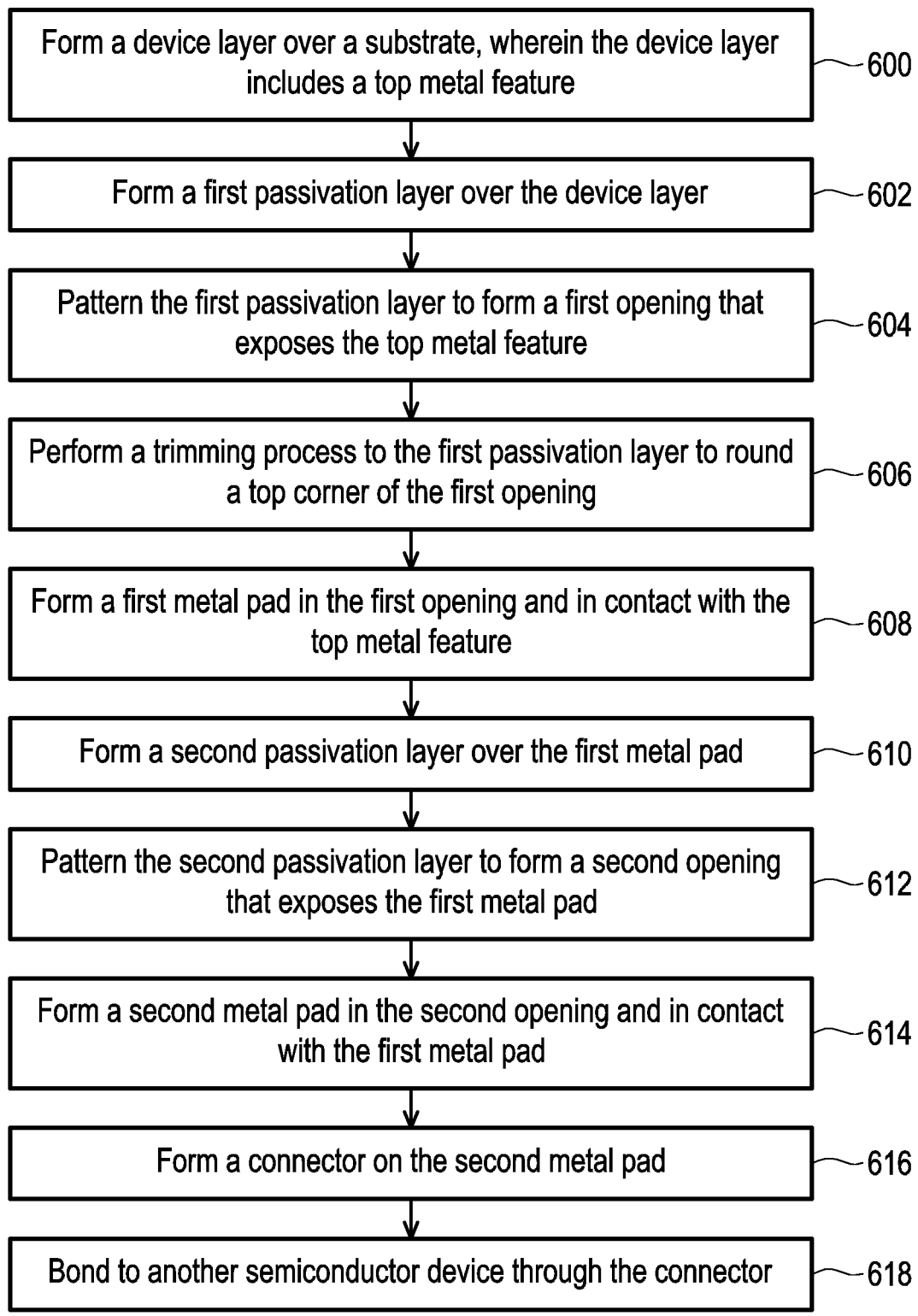
FIG. 13 is a flow chart of a method of forming a semiconductor device in accordance with some embodiments.

FIG. 13 is a flow chart of a method of forming a conductive structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 600, a device layer is formed over a substrate, wherein the device layer includes a top metal feature. FIG. 1 illustrates a cross-sectional view corresponding to some embodiments of act 600.

At act 602, a first passivation layer is formed over the device layer. FIG. 2 illustrates a cross-sectional view corresponding to some embodiments of act 602.

At act 604, the first passivation layer is patterned to form a first opening that exposes the top metal feature. FIG. 3 illustrates a cross-sectional view corresponding to some embodiments of act 604.

At act 606, a trimming process is performed to the first passivation layer to round a top corner of the first opening. FIG. 4 illustrates a cross-sectional view corresponding to some embodiments of act 606.

At act 608, a first metal pad is formed in the first opening and in contact with the top metal feature. In some embodiments, the first metal pad is an aluminum pad formed at a low process temperature of about 250° C. to 300° C. FIG. 5 to FIG. 6, FIG. 11 and FIG. 12 illustrates cross-sectional views corresponding to some embodiments of act 608.

At act 610, a second passivation layer is formed over the first metal pad. In some embodiments, a void is formed and enclosed by part of the first metal pad and part of the second passivation layer during the step of forming the second passivation layer. FIG. 7 illustrates a cross-sectional view corresponding to some embodiments of act 610.

At act 612, the second passivation layer is patterned to form a second opening that exposes the first metal pad. In some embodiments, a second included angle between a sidewall and a bottom of the second opening of the second passivation layer is less than a first included angle between the sidewall and the bottom of the first opening of the first passivation layer. FIG. 8 illustrates a cross-sectional view corresponding to some embodiments of act 612.

At act 614, a second metal pad is formed in the second opening and in contact with the first metal pad. FIG. 9 to FIG. 10, FIG. 11 and FIG. 12 illustrates cross-sectional views corresponding to some embodiments of act 614.

At act 616, a connector is formed on the second metal pad. FIG. 10, FIG. 11 and FIG. 12 illustrates cross-sectional views corresponding to some embodiments of act 616.

At act 618, another semiconductor device is bonded to the formed semiconductor device through the connector.

In some embodiments of the disclosure, the top corner of the opening of the passivation layer in which the low-temperature metal pad is subsequently formed is rounded before the metal pad forming step. Such rounded corner of the opening of the passivation layer promises a better filling and step coverage in the step of forming the metal pad, and thus, a void-free metal pad can be easily obtained.

In accordance with some embodiments of the present disclosure, a semiconductor device includes a device layer, a first passivation layer, an aluminum pad, a second passivation layer, an under-ball metallurgy (UBM) pad and a connector. The device layer is disposed over a substrate, wherein the device layer includes a top metal feature. The first passivation layer is disposed over the device layer. The aluminum pad penetrates through the first passivation layer and is electrically connected to the top metal feature. The second passivation layer is disposed over the aluminum pad. The UBM pad penetrates through the second passivation layer and is electrically connected to the aluminum pad. The connector is disposed over the UBM pad. In some embodiments, a first included angle between a sidewall and a bottom of the aluminum pad is greater than a second included angle between a sidewall and a bottom of the UBM pad.

In accordance with some embodiments of the present disclosure, a semiconductor device includes a device layer, a first passivation layer, a first metal pad, a second passivation layer, a second metal pad and a connector. The device layer is disposed over a substrate, wherein the device layer includes a top metal feature. The first passivation layer is disposed over the device layer. The first metal pad penetrates through the first passivation layer and is electrically connected to the top metal feature. The second passivation layer is disposed over the first metal pad. The second metal pad penetrates through the second passivation layer and is electrically connected to the first metal pad. The connector is disposed over the second metal pad. In some embodiments, the second metal pad has a main portion and a protruding portion extending from the main portion, and the protruding portion is embedded in the first metal pad.

In accordance with some embodiments of the present disclosure, a method of forming a semiconductor device includes: forming a device layer over a substrate, wherein the device layer comprises a top metal feature; forming a first passivation layer over the device layer; patterning the first passivation layer to form a first opening that exposes the top metal feature; performing a trimming process to the first passivation layer to round a top corner of the first opening; forming a first metal pad in the first opening and in contact with the top metal feature; forming a second passivation layer over the first metal pad; patterning the second passivation layer to form a second opening that exposes the first metal pad; and forming a second metal pad in the second opening and in contact with the first metal pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a device layer over a substrate, wherein the device layer comprises a top metal feature;
    forming a first passivation layer over the device layer;
    patterning the first passivation layer to form a first opening that exposes the top metal feature;
    performing a trimming process to the first passivation layer to round a top corner of the first opening;
    forming a first metal pad in the first opening and in contact with the top metal feature;
    forming a second passivation layer over the first metal pad;
    patterning the second passivation layer to form a second opening that exposes the first metal pad; and
    forming a second metal pad in the second opening and in contact with the first metal pad.

2. The method of claim 1, wherein the first metal pad is an aluminum pad formed at a low process temperature of about 250° C. to 300° C.

3. The method of claim 1, wherein a void is formed and enclosed by part of the first metal pad and part of the second passivation layer during the step of forming the second passivation layer.

4. The method of claim 1, wherein the first metal pad is formed with a concave portion on a top surface thereof, and the second metal pad is formed with a convex portion on a bottom surface thereof, and the convex portion of the second metal pad is engaged in the concave portion of the first metal pad.

5. The method of claim 1, further comprising:
    forming a connector on the second metal pad; and
    bonding to another semiconductor device through the connector.

6. The method of claim 1, wherein a second included angle between a sidewall and a bottom of the second opening of the second passivation layer is less than a first included angle between the sidewall and the bottom of the first opening of the first passivation layer.

7. A method of forming a semiconductor device, comprising:
    forming a device layer over a substrate, wherein the device layer comprises a top metal feature;
    forming a first passivation layer over the device layer;
    forming an aluminum pad penetrating through the first passivation layer and electrically connected to the top metal feature;
    forming a second passivation layer over the aluminum pad;
    forming an under-ball metallurgy (UBM) pad penetrating through the second passivation layer and electrically connected to the aluminum pad; and
    forming a connector over the UBM pad,
    wherein a first included angle between a sidewall and a bottom of the aluminum pad is greater than a second included angle between a sidewall and a bottom of the UBM pad, and
    wherein the first passivation layer has a rounded top corner in contact with the aluminum pad.

8. The method of claim 7, wherein the aluminum pad has a recess on a surface thereof, and the UBM pad fills into the recess.

9. The method of claim 8, wherein the recess of the aluminum pad has a wide-top and narrow-middle profile.

10. The method of claim 7, wherein a void is further present between the aluminum pad and the UBM pad.

11. The method of claim 7, wherein the aluminum pad is formed at a low process temperature of about 250° C. to 300° C.

12. The method of claim 7, wherein the first included angle ranges from about 100 to 120 degrees.

13. The method of claim 7, wherein the second included angle ranges from about 85 to 95 degrees.

14. The method of claim 7, further comprising forming a glue layer between the aluminum pad and the first passivation layer.

15. A method of forming a semiconductor device, comprising:
    forming a device layer over a substrate, wherein the device layer comprises a top metal feature;
    forming a first passivation layer over the device layer;
    forming a first metal pad penetrating through the first passivation layer and electrically connected to the top metal feature;
    forming a second passivation layer over the first metal pad;
    forming a second metal pad penetrating through the second passivation layer and electrically connected to the first metal pad; and
    forming a connector over the second metal pad,
    wherein the second metal pad has a main portion and a protruding portion extending from the main portion, and the protruding portion is embedded in the first metal pad.

16. The method of claim 15, wherein a distance from a top corner of the first passivation layer to a corner of the protruding portion of the second metal pad is defined as "A", a thickness of the first metal pad is defined as "B", and a ratio of "A" to "B" is about 25% to 60%.

17. The method of claim 15, wherein the first metal pad and the second metal pad comprise different materials.

18. The method of claim 15, wherein the first metal pad comprises aluminum, and the second metal pad comprises copper.

19. The method of claim 15, wherein a first included angle between a sidewall and a bottom of the first metal pad is different from a second included angle between a sidewall and a bottom of the second metal pad.

20. The method of claim 15, wherein the connector covers a sidewall of the second metal pad.

\* \* \* \* \*